United States Patent
Tang et al.

(10) Patent No.: US 9,306,155 B2
(45) Date of Patent: Apr. 5, 2016

(54) METHOD AND SYSTEM FOR PROVIDING A BULK PERPENDICULAR MAGNETIC ANISOTROPY FREE LAYER IN A PERPENDICULAR MAGNETIC JUNCTION USABLE IN SPIN TRANSFER TORQUE MAGNETIC RANDOM ACCESS MEMORY APPLICATIONS

(71) Applicant: Samsung Electronics Co., LTD., Gyeonggi-do (KR)

(72) Inventors: Xueti Tang, San Jose, CA (US); Jang Eun Lee, Cupertino, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 146 days.

(21) Appl. No.: 14/171,574

(22) Filed: Feb. 3, 2014

(65) Prior Publication Data

US 2015/0129993 A1    May 14, 2015

Related U.S. Application Data

(60) Provisional application No. 61/902,691, filed on Nov. 11, 2013.

(51) Int. Cl.
| | | |
|---|---|---|
| *H01L 29/82* | (2006.01) | |
| *H01L 43/10* | (2006.01) | |
| *H01L 43/12* | (2006.01) | |
| *H01L 43/08* | (2006.01) | |

(52) U.S. Cl.
CPC ............... *H01L 43/10* (2013.01); *H01L 43/08* (2013.01); *H01L 43/12* (2013.01)

(58) Field of Classification Search
CPC ..... H01L 43/08; H01L 29/82; H01L 23/5226; H01L 23/528; H01L 27/222; H01L 43/065; G11C 11/16

USPC ............ 257/421–427, E29.323; 438/3; 360/324–326, 313; 365/157–158, 365/171–173
See application file for complete search history.

(56) References Cited

U.S. PATENT DOCUMENTS

| | | |
|---|---|---|
| 8,107,281 B2 | 1/2012 | Kai |
| 8,319,297 B2 | 11/2012 | Min |
| 8,416,620 B2 | 4/2013 | Zheng |
| 8,514,617 B2 | 8/2013 | Yamada |
| 2008/0100964 A1 | 5/2008 | Fullerton |

(Continued)

OTHER PUBLICATIONS

J. H. Jung, S. H. Lim and S. R. Lee, "Strong perpendicular magnetic anisotropy in a mg/cofeb/pd unit structure with a thick cofeb/pd layer," Journal of Applied Physics, vol. 108, No. 11, p. 113902-5, Dec. 2, 2010.

*Primary Examiner* — Jami M Valentine
(74) *Attorney, Agent, or Firm* — Convergent Law Group LLP

(57) ABSTRACT

A magnetic junction usable in a magnetic device and a method for providing the magnetic junction are described. The magnetic junction includes a free layer, a pinned layer and nonmagnetic spacer layer between the free and pinned layers. The free layer includes at least one of a hybrid perpendicular magnetic anisotropy (PMA) structure and tetragonal bulk perpendicular magnetic anisotropy (B-PMA) structure. At least one of the free layer and the pinned layer have a perpendicular magnetic anisotropy energy greater than an out-of-plane demagnetization energy. The magnetic junction is configured such that the free layer is switchable between a plurality of stable magnetic states when a write current is passed through the magnetic junction.

19 Claims, 7 Drawing Sheets

(56) References Cited

U.S. PATENT DOCUMENTS

| | | |
|---|---|---|
| 2010/0142088 A1 | 6/2010 | Iwasaki |
| 2012/0069642 A1 | 3/2012 | Ueda |
| 2012/0104522 A1* | 5/2012 | Jung .................. H01F 10/3254 257/421 |
| 2012/0146167 A1* | 6/2012 | Huai ...................... H01L 43/08 257/421 |
| 2013/0154034 A1* | 6/2013 | Apalkov ................ H01L 43/08 257/421 |
| 2013/0175644 A1 | 7/2013 | Horng |
| 2014/0077319 A1* | 3/2014 | Noma .................... H01L 43/02 257/421 |
| 2015/0048464 A1* | 2/2015 | Park .................... G11C 11/161 257/421 |
| 2015/0129997 A1* | 5/2015 | Tang ...................... H01L 43/12 257/427 |

* cited by examiner

METHOD AND SYSTEM FOR PROVIDING A BULK PERPENDICULAR MAGNETIC ANISOTROPY FREE LAYER IN A PERPENDICULAR MAGNETIC JUNCTION USABLE IN SPIN TRANSFER TORQUE MAGNETIC RANDOM ACCESS MEMORY APPLICATIONS

CROSS-REFERENCE TO RELATED APPLICATIONS

This application claims the benefit of provisional Patent Application Ser. No. 61/902,691, filed Nov. 11, 2013, entitled BULK PERPENDICULAR MAGNETIC ANISOTROPY FREE LAYER PERPENDICULAR MAGNETIC ELEMENT USABLE IN SPIN TRANSFER TORQUE MAGNETIC RANDOM ACCESS MEMORY APPLICATIONS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 24 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional pinned layer 16, a conventional tunneling barrier layer 18, and a conventional free layer 20. Also shown is top contact 22. Conventional contacts 14 and 24 are used in driving the current in a current-perpendicular-to-plane (CPP) direction, or along the z-axis as shown in FIG. 1. Typically, the conventional pinned layer 16 is closest to the substrate 12 of the layers 16, 18 and 20.

The conventional pinned layer 16 and the conventional free layer 20 are magnetic. The magnetization 17 of the conventional pinned layer 16 is fixed, or pinned, in a particular direction. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as perpendicular-to-plane, the magnetization 21 of the conventional free layer 20 may be in plane. Thus, the pinned layer 16 and free layer 20 may have their magnetizations 17 and 21, respectively oriented perpendicular to the plane of the layers.

To fabricate the conventional magnetic junction 10, the layers 16, 18 and 20 are deposited. After the layer 16, 18 and 20 has been provided, the magnetic junction 10 is annealed. This annealing assists in the crystallization of the conventional tunneling barrier 18, which may be amorphous as-deposited. The layers for the conventional magnetic junction 10 are then milled to define the edges of the conventional magnetic junction 10.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional pinned layer 16. When a sufficient current is driven from the bottom contact 11 to the top contact 22, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. The magnetic junction includes a free layer, a pinned layer and nonmagnetic spacer layer between the free and pinned layers. The free layer includes at least one of a hybrid perpendicular magnetic anisotropy (PMA) structure and tetragonal bulk perpendicular magnetic anisotropy (B-PMA) structure. At least one of the free layer and the pinned layer have a perpendicular magnetic anisotropy energy greater than an out-of-plane demagnetization energy. The magnetic junction is configured such that the free layer is switchable between a plurality of stable magnetic states when a write current is passed through the magnetic junction.

DETAILED DESCRIPTION OF THE INVENTION

Figure 1:
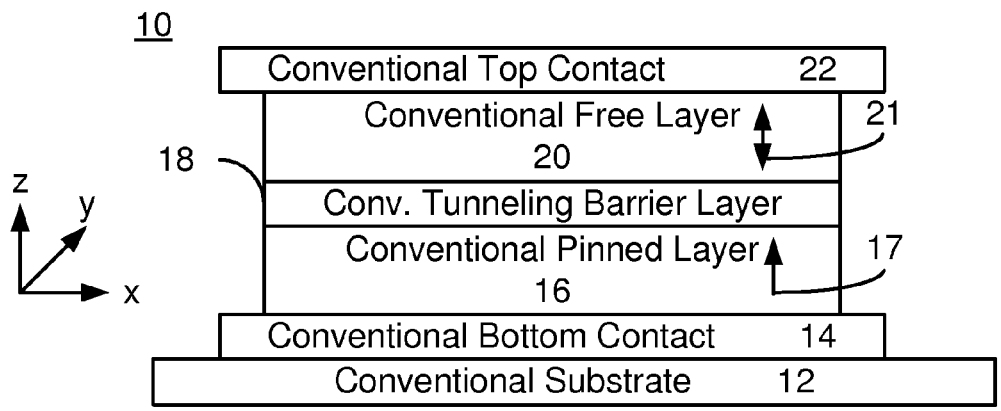
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction usable in a magnetic device and a method for providing the magnetic junction are described. The magnetic junction includes a free layer, a pinned layer and nonmagnetic spacer layer between the free and pinned layers. The free layer includes at least one of a hybrid perpendicular magnetic anisotropy (PMA) structure and tetragonal bulk perpendicular magnetic anisotropy (B-PMA) structure. At least one of the free layer and the pinned layer have a perpendicular magnetic anisotropy energy greater than an out-of-plane demagnetization energy. The magnetic junction is configured such that the free layer is switchable between a plurality of stable magnetic states when a write current is passed through the magnetic junction.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
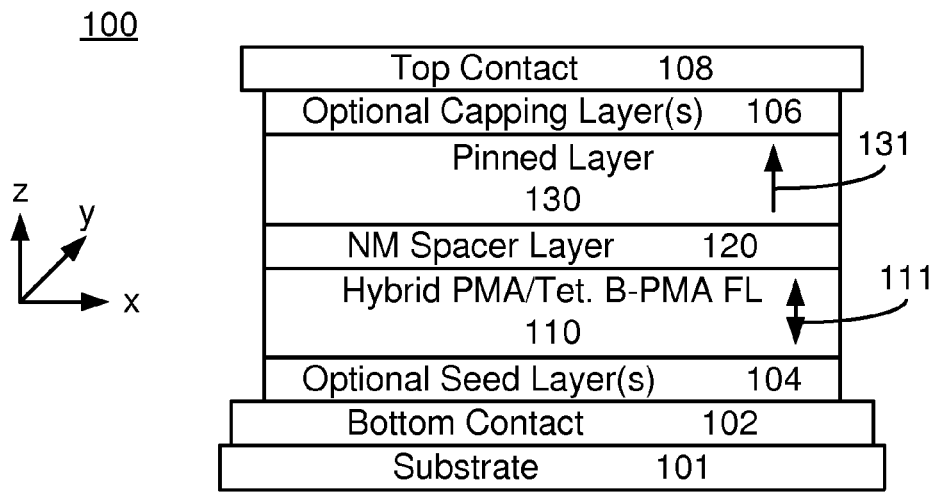
FIG. 2 depicts an exemplary embodiment of a magnetic junction including a high PMA free layer and usable in a magnetic memory programmable using spin transfer torque.

FIG. 2 depicts an exemplary embodiment of a magnetic junction 100 having a high perpendicular magnetic anisotropy (PMA) free layer and which is usable in a magnetic memory programmable utilizing spin transfer. For clarity, FIG. 2 is not to scale. The magnetic junction 100 may be used in a magnetic device such as a STT-RAM and, therefore, in a variety of electronic devices. The magnetic junction 100 includes a free layer 110 having magnetic moment 111, a nonmagnetic spacer layer 120, and a pinned layer 130 having magnetic moment 131. Also shown is an underlying substrate 101 in which devices including but not limited to a transistor may be formed. Bottom contact 102, top contact 108, optional seed layer(s) 104 and optional capping layer(s) 106 are also shown. As can be seen in FIG. 2, the pinned layer 130 is closer to the top (furthest from a substrate 201) of the magnetic junction 100. However, in other embodiments, the pinned layer 130 may be closer to the substrate 101 than the free layer 110. An optional pinning layer (not shown) may be used to fix the magnetization (not shown) of the pinned layer 130. In some embodiments, the optional pinning layer may be an AFM layer or multilayer that pins the magnetization (not shown) of the pinned layer 130 by an exchange-bias interaction. However, in other embodiments, the optional pinning layer may be omitted or another structure may be used.

The nonmagnetic spacer layer 120 may be an MgO tunneling barrier layer. The MgO layer may have a 200 orientation for enhanced tunneling magnetoresistance (TMR). In some embodiments, the free layer 110 and nonmagnetic spacer layer 120 may be annealed prior to formation of the pinned layer 120. This may allow a higher temperature anneal to be used and improved crystallographic orientation of the nonmagnetic pacer layer 120 without affecting the pinned layer 130.

The pinned layer 130 is magnetic. In some embodiments, the pinned layer 130 may be a multilayer. For example, the pinned layer 130 may be a SAF including multiple ferromagnetic layers interleaved with nonmagnetic layer(s). In such embodiments, the magnetic moments of the ferromagnetic layers maybe coupled antiparallel. Each ferromagnetic layer may also include sublayers including but not limited to multiple ferromagnetic layers. In other embodiments, the pinned layer 130 may be another multilayer. An optional pinning layer (not shown) may be used to fix the magnetization (not shown) of the pinned layer 130. Further, a polarization enhancement layer (PEL) having a high spin polarization may be provided between the pinned layer 130 and the magnetic spacer layer 120. In some embodiments, the PEL may include CoFeB, FeB, a Fe/CoFeB bilayer, a half metal and/or a Heusler alloy. The PEL might also include an insertion layer like W, Ta or V along with the magnetic materials. For example, a PEL might be a layer including one or more repeats of a W/CoFeB bilayer, a Ta/CoFeB bilayer, and/or a CoFeB/W/CoFeB trilayer. The half metal and/or a Heusler alloy could be but not limited to be one or more of $Co_2FeAl$, $Co_2FeAlSi$, Co2MnSi and MnAl. In some embodiments, the pinned layer 130 may include a bulk PMA structure and/or hybrid PMA structure that is analogous to that described for the free layer, below.

The perpendicular magnetic anisotropy energies of free layer 110 and pinned layer 130 exceed their out-of-plane demagnetization energies. Consequently, the magnetic moments 111 and 131 of the free layer 110 and the pinned layer 130, respectively, may be perpendicular to plane. The magnetic junction 100 is also configured to allow the free layer 110 to be switched between stable magnetic states when a write current is passed through the magnetic junction 100. Thus, the free layer 110 is switchable utilizing spin transfer torque.

The free layer 110 includes at least one of a hybrid PMA structure and a bulk-PMA (B-PMA) structure. As a result, the free layer 110 may have a high PMA. In some embodiments, the free layer 110 has a perpendicular magnetic anisotropy energy equal to a field of at least five thousand Oe. In some such embodiments, the free layer 110 has a perpendicular magnetic anisotropy energy equal to a field of at least ten thousand Oe. A hybrid PMA structure includes at least a B-PMA layer, an interfacial PMA (I-PMA) layer and an optional coupling layer between the B-PMA layer and the I-PMA layer. In some embodiments, multiple B-PMA and I-PMA layers may be used. For example a multilayer including an I-PMA layer and a B-PMA layer might have at least one and not more than three repeats. In such embodiments, the B-PMA and I-PMA layers may be alternated and separated by coupling layers. A B-PMA layer or structures is one in which it is believed that the PMA arises from materials in the bulk rather than interfacial characteristic(s) and/or interactions. An I-PMA layer, as its name suggests, has a PMA that is believed to be from interfacial characteristic and/or interactions. In some embodiments, the I-PMA layer thickness could be in the range of at least five Angstroms to not more than thirty Angstroms. Examples of B-PMA materials may include but are not limited to FePd, FePdB, CoPt, CoPd, FePt, TbCoFe, GaMn, Co/Pd bilayer(s), Co/Pt bilayer(s), Fe/Pt bilayer(s), Co/Ni bilayer(s), Tb/CoFe bilayer(s) and Co/TbCoFe bilayer(s). At least some materials, such as CoPd, CoPt and GaMn may be tetragonal B-PMA materials if they have a tetragonal crystal structure such as L10 and/or L11, particularly for a 200 orientation. Such materials are termed tetragonal B-PMA herein. Other B-PMA materials may have other crystal structures. In general, a thicker layer of a B-PMA material has a higher PMA. In some embodiments, the B-PMA layer thickness could be in the range of at least five Angstroms to not more than one hundred Angstroms. In contrast, an I-PMA layer may have a local maximum in PMA at lower thicknesses, for example at a thickness of less than twenty Angstroms. This is because bulk phenomena tend to dominate where the surface area to volume ratio decreases. Examples of I-PMA material(s) include but are not limited to CoFeB, CoB, certain half-metals and Heusler alloy(s). In some embodiments, the half metals and Heusler alloys may include but are not limited to be one or more of $Co_2FeAl$, $Co_2FeAlSi$, $Co_2MnSi$ and/or MnAl.

The coupling layer(s) used in the hybrid B-PMA structure may be configured to control the coupling between the I-PMA and the B-PMA layers. For example, the I-PMA and B-PMA layer(s) may be ferromagnetically coupled by exchange coupling or through the optional coupling layer. Such coupling layers are nonmagnetic and may include but are not limited to Ta, Ru, Cr, Ti, W, V, Mg, and MgO. In some such embodiments, low RA MgO may be used. For example a low RA MgO layer might have an RA of at least 0.2 and not more than five. Low RA MgO may be formed by naturally oxidizing an Mg layer. The thickness of the coupling layer(s) may also be used to moderate the interaction between the I-PMA and B-PMA layers. For example, thicker coupling layers may reduce the magnetic interaction. In some embodiments, the coupling layers are at least one Angstrom thick and no more than ten Angstroms thick. In some embodiments, the coupling layer might be not more than five Angstroms thick. In some such embodiments, each coupling layer is not more than two or three Angstroms thick.

In some embodiments, the seed layer(s) 104 and other layers may be configured to improve the characteristics of the free layer 110. For example, the seed layer(s) 104 may be configured to reduce the intrinsic damping constant of the free layer 110, improve the crystal structure of the free layer 110, or perform other functions. For example, the seed layer(s) 104 may include but are not limited to Ta, Ru, AlN, TiN, TiAlN, tantalum oxide, V and aluminum oxide.

The magnetic junction 100 and free layer 110 may have improved performance. Use of the hybrid B-PMA structure and/or tetragonal B-PMA material(s) in the free layer 110 may improve the thermal stability of the free layer 110 by enhancing the PMA. This is because the B-PMA layer(s) may have a high PMA. However, without more, such layers may have a high intrinsic damping constant as well as a low spin polarization. These characteristics might otherwise adversely impact performance of the magnetic junction 100. The use of the I-PMA materials in the free layer 110 may enhance the TMR and the spin transfer torque for example by increasing the spin polarization and reducing the total damping constant of the free layer 110. In turn, the thermal stability of the I-PMA layer may be enhanced by the presence of the B-PMA layer. Thus, the free layer 110 may have lower magnetic damping, higher magnetoresistance and/or improved thermal stability. In embodiments in which the pinned layer 130 is provided after an anneal for the nonmagnetic layer 120 is performed, performance may be further improved. For such an embodiment, a higher anneal temperature may be used. As a result, the nonmagnetic spacer layer 120 may be better crystallized and have a texture more highly oriented in the desired direction. For example, an improved crystalline MgO nonmagnetic spacer layer 120 that has more of the film oriented in the 200. Consequently, a higher magnetoresistance may be achieved. Thus, performance of the magnetic junction 100 may be enhanced.

Figure 3:
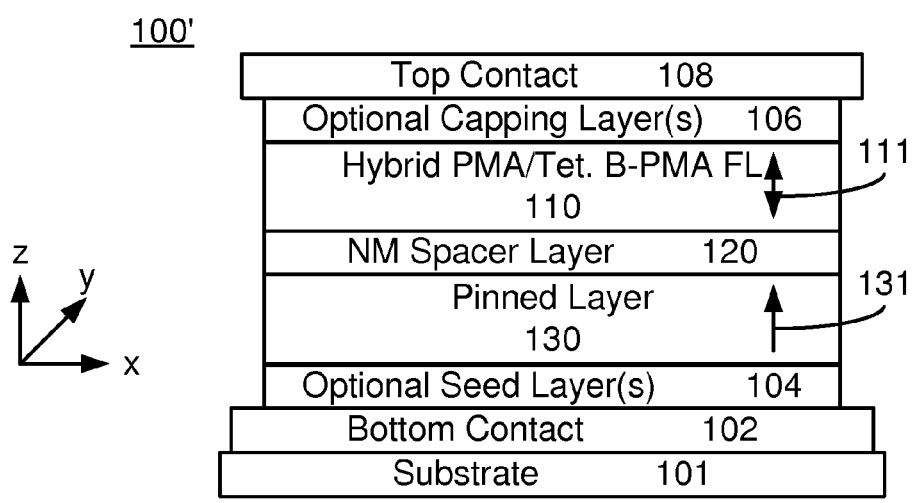
FIG. 3 depicts another exemplary embodiment of a magnetic junction including a high PMA free layer and usable in a magnetic memory programmable using spin transfer torque.

FIG. 3 depicts an exemplary embodiment of a magnetic junction 100' including a high PMA free layer and usable in a magnetic memory programmable using spin transfer torque, as well as surrounding structures. For clarity, FIG. 3 is not to scale. The magnetic junction 100' may be used in a magnetic device such as a STT-RAM and, therefore, in a variety of electronic devices. The magnetic junction 100' is analogous to the magnetic junction 100. Consequently, similar components have analogous labels. The magnetic junction 100' includes a free layer 110 having magnetic moment 111, a nonmagnetic spacer layer 120, and a pinned layer 130 having magnetic moment 131 that are analogous to the free layer 110 having magnetic moment 111, the nonmagnetic spacer layer 120, and the pinned layer 130 having magnetic moment 131, respectively, depicted in the magnetic junction 100. Also shown are an underlying substrate 101, bottom contact 102, top contact 108, optional seed layer(s) 104 and optional capping layer(s) 106 that may be analogous to the substrate 101, bottom contact 102, top contact 108, optional seed layer(s) 104 and optional capping layer(s) 106 for the magnetic junction 100.

As can be seen in FIG. 3, the magnetic junction 100' is a bottom pinned junction instead of a top pinned junction. Stated differently, the pinned layer 130 is closer to the bottom/substrate 101 for the magnetic junction 100'. An optional pinning layer (not shown) may be used to fix the magnetization (not shown) of the pinned layer 130. In some embodiments, the optional pinning layer may be an AFM layer or multilayer that pins the magnetization (not shown) of the pinned layer 130 by an exchange-bias interaction. However, in other embodiments, the optional pinning layer may be omitted or another structure may be used. In such an embodiment, the optional seed layer(s) may be configured for the pinned layer 130. In contrast, the capping layer(s) 106 may be configured for the free layer 110. For example, the capping layer(s) 106 may enhance the PMA and/or reduce the damping constant of the free layer 110. Thus, the capping layer(s) 106 may include materials analogous to the seed layers for the magnetic junction 100.

The magnetic junction 100' and free layer 110 may have improved performance. In particular, the magnetic junction 100' may share the benefits of the magnetic junction 100. Use of the hybrid PMA and/or B-PMA structures may improve the thermal stability, PMA, damping constant and/or magnetoresistance of the magnetic junction 100'. However, note that the pinned layer 130 is formed before the free layer 110 in the magnetic junction 100'. Thus, a lower temperature anneal may be used for the nonmagnetic spacer layer 120. However, other benefit(s) of the magnetic junction 100 may still be achieved in the magnetic junction 100'.

Figure 4:
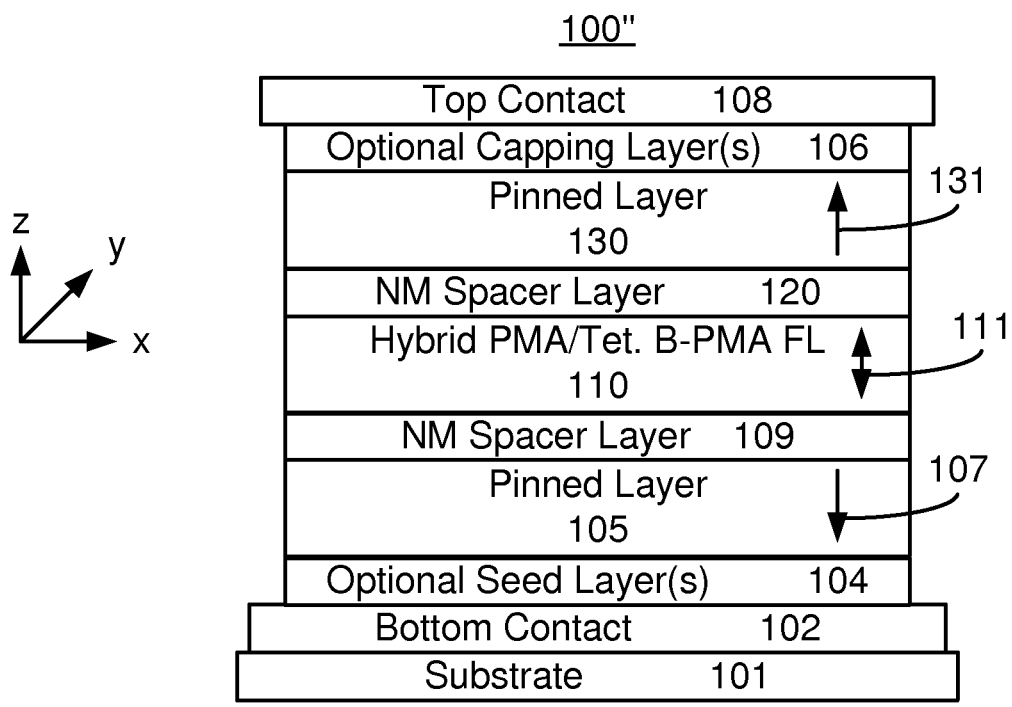
FIG. 4 depicts another exemplary embodiment of a magnetic junction including a high PMA free layer and usable in a magnetic memory programmable using spin transfer torque.

FIG. 4 depicts an exemplary embodiment of a magnetic junction 100" including a high PMA free layer and usable in a magnetic memory programmable using spin transfer torque, as well as surrounding structures. For clarity, FIG. 4 is not to scale. The magnetic junction 100" may be used in a magnetic device such as a STT-RAM and, therefore, in a variety of electronic devices. The magnetic junction 100" is analogous to the magnetic junction(s) 100 and/or 100'. Consequently, similar components have analogous labels. The magnetic junction 100' includes a free layer 110 having magnetic moment 111, a nonmagnetic spacer layer 120, and a pinned layer 130 having magnetic moment 131 that are analogous to the free layer 110 having magnetic moment 111, the nonmagnetic spacer layer 120, and the pinned layer 130 having magnetic moment 131, respectively, depicted in the magnetic junction 100. Also shown are an underlying substrate 101, bottom contact 102, top contact 108, optional seed layer(s) 104 and optional capping layer(s) 106 that may be analogous to the substrate 101, bottom contact 102, top contact 108, optional seed layer(s) 104 and optional capping layer(s) 106 for the magnetic junction 100.

As can be seen in FIG. 4, the magnetic junction 100" is a dual magnetic junction. Thus, the magnetic junction 100" also includes an additional pinned layer 105 having a magnetic moment 107 and an additional nonmagnetic spacer layer 109. The magnetic junction 100" is shown in the dual state, with the magnetic moments 107 and 131 antiparallel. Such a state is desired for programming. However, for reading, the magnetic junction 100" may be in the antidual state (magnetic moments 107 and 131 aligned) or the magnetic junction 100" may be configured such that the magnetoresistances differ between a first state having the magnetic moment 111 aligned with the magnetic moment 131 and a second state in which the magnetic moment 100 is aligned with the magnetic moment 107. The nonmagnetic spacer layer 109 may be configured for the free layer 110, rather than simply to enhance magnetoresistance. For example, the nonmagnetic spacer layer 109 may enhance the PMA and/or reduce the damping constant of the free layer 110. Thus, the nonmagnetic spacer layer 109 may include materials analogous to the seed layers for the magnetic junction 100.

The magnetic junction 100" may have improved performance. In particular, the magnetic junction 100" may share the benefits of the magnetic junction(s) 100 and/or 100'. Use of the hybrid PMA and/or B-PMA structures may improve the thermal stability, PMA, damping constant and/or magnetoresistance of the magnetic junction 100".

Figure 5:
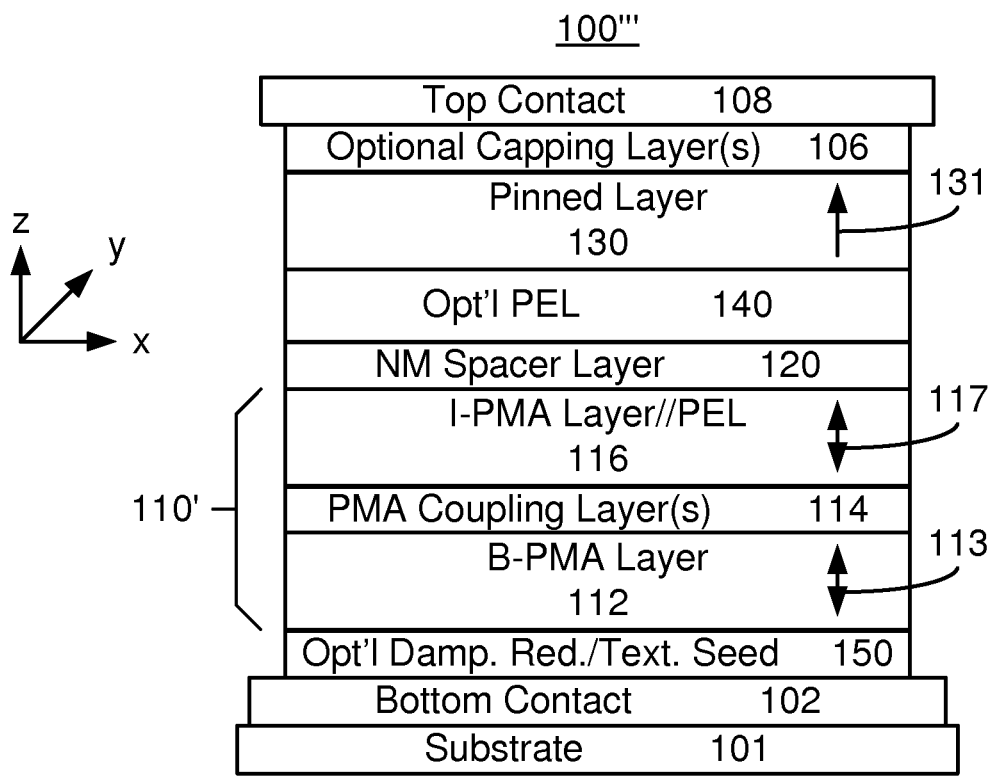
FIG. 5 depicts another exemplary embodiment of a magnetic junction including a high PMA free layer and usable in a magnetic memory programmable using spin transfer torque.

FIG. 5 depicts an exemplary embodiment of a magnetic junction 100''' including a high PMA free layer and usable in a magnetic memory programmable using spin transfer torque, as well as surrounding structures. For clarity, FIG. 5 is not to scale. The magnetic junction 100''' may be used in a magnetic device such as a STT-RAM and, therefore, in a variety of electronic devices. The magnetic junction 100''' is analogous to the magnetic junction(s) 100, 100' and/or 100". Consequently, similar components have analogous labels. The magnetic junction 100''' includes a free layer 110' having magnetic moment 111, a nonmagnetic spacer layer 120, and a pinned layer 130 having magnetic moment 131 that are analogous to the free layer 110 having magnetic moment 111, the nonmagnetic spacer layer 120, and the pinned layer 130 having magnetic moment 131, respectively, depicted in the magnetic junctions 100, 100' and 100". Also shown are an underlying substrate 101, bottom contact 102, top contact 108 and optional capping layer(s) 106 that may be analogous to the substrate 101, bottom contact 102, top contact 108 and optional capping layer(s) 106 for the magnetic junctions 100, 100' and 100".

As can be seen in FIG. 5, the magnetic junction 100" is a top pinned junction. However, either a top pinned or a bottom pinned magnetic junction may be used. The free layer 110' has a high PMA. In some embodiments, the free layer 110' has a PMA energy equal to a field of at least five thousand Oe. In some such embodiments, the free layer 110' has a PMA energy equal to a field of at least ten thousand Oe. The free layer 110' is also depicted as explicitly including a B-PMA layer 112 having magnetic moment 113, coupling layer 114 and I-PMA layer/PEL 116 having a magnetic moment 117. The B-PMA layer 112 may be as discussed above. For example, the B-PMA layer 112 may include but is not limited to FePd, FePdB, CoPt, CoPd, FePt, TbCoFe, GaMn, Co/Pd bilayer(s), Co/Pt bilayer(s), Fe/Pt bilayer(s), Co/Ni bilayer(s), Tb/CoFe bilayer(s) and Co/TbCoFe bilayer(s). Thus, the B-PMA layer 112 may be a tetragonal B-PMA layer. The I-PMA layer 116 may include but is not limited to CoFeB, CoB, certain half-metals and Heusler alloy(s), The I-PMA layer 116 is also indicated to be a PEL. This is because the I-PMA layer 116 also generally has a higher spin polarization than the B-PMA layer 112. In some embodiments, multiple B-PMA and I-PMA layers may be used. In such embodiments, the B-PMA and I-PMA layers may be alternated and separated by coupling layers.

Also shown in FIG. 5 is an optional PEL 140 for the pinned layer 130. The optional PEL may have a high spin polarization and may include material(s) such as CoFeB and/or Fe. For example, the PEL 140 may include be a bilayer of Fe/CoFeB or a layer of CoFeB, FeB, half metal and/or a Heusler alloy. Insertion layer(s) may also be between the pinned layer 130 and the PEL 140. For example, a W layer, an Fe layer, or a Fe/W/Fe trilayer might be used.

In the embodiment shown, the seed layer(s) 150 are explicitly configured to improve the characteristics of the free layer 110'. More specifically, the seed layer(s) 150 may be configured to reduce the intrinsic damping constant of the B-PMA layer 112 and/or provide a growth template for a tetragonal B-PMA layer 112 having a 200 orientation and an L10 or L11 crystal structure. The seed layer(s) 150 may include but are not limited to Ta, Ru, AlN, TiN, TiAlN, tantalum oxide, V and aluminum oxide.

The magnetic junction 100'" and free layer 110' may have improved performance. In particular, the magnetic junction 100" may share the benefits of the magnetic junction 100 100', and/or 100". Use of the I-PMA layer 116, B-PMA layer 112 and coupling layer 114 may improve the thermal stability, PMA, damping constant and/or magnetoresistance of the magnetic junction 100'". Because the pinned layer 130 is formed after the free layer 110 and nonmagnetic spacer layer 120, a higher temperature anneal may be used for the nonmagnetic spacer layer 120 before formation of the pinned layer 130. Thus, an improved TMR may be obtained.

Figure 6:
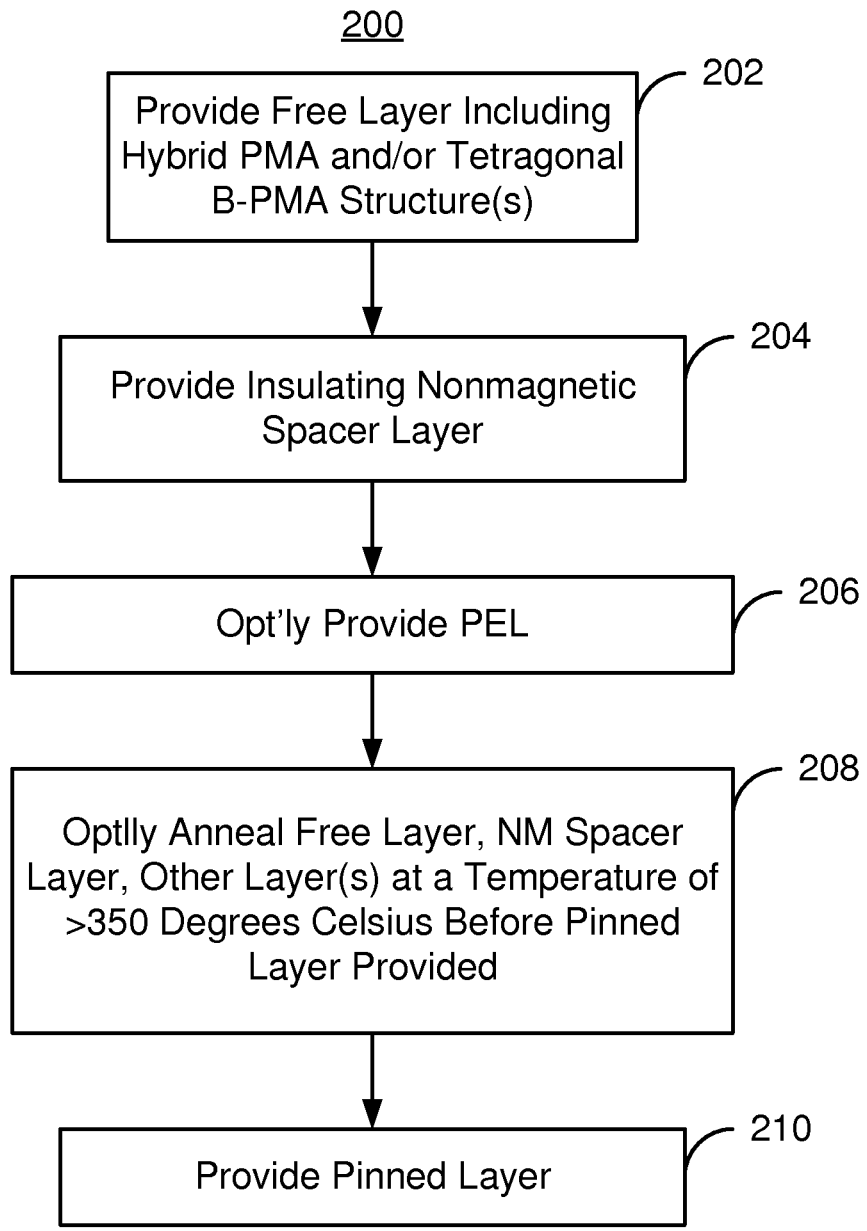
FIG. 6 is a flow chart depicting an exemplary embodiment of a method for providing a magnetic junction including a high PMA free layer and usable in a magnetic memory programmable using spin transfer torque.

FIG. 6 depicts an exemplary embodiment of a method 200 for fabricating a magnetic junction including a high PMA free layer and usable in a magnetic device such as a spin transfer torque random access memory (STT-RAM) and, therefore, in a variety of electronic devices. For simplicity, some steps may be omitted, performed in another or combined. Further, the method 200 may start after other steps in forming a magnetic memory have been performed. For simplicity, the method 200 is described in the context of the magnetic junction 100. However, other magnetic junctions may be formed.

A free layer 110 including a hybrid PMA and/or tetragonal B-PMA structure is provided on the substrate, via step 202. In some embodiments, step 202 includes depositing the material(s) for the free layer 110. For example, the B-PMA layer, coupling layer and I-PMA layer materials may be deposited. The free layer 110 may be formed on seed layer(s). The seed layer(s) may be selected for various purposes including but not limited to the desired crystal structure of the free layer 110, magnetic anisotropy and/or magnetic damping of the free layer 110, particularly the B-PMA layer 112. Further, interface modification layer(s) and other layers may also be provided before the free layer 110 is formed. The edges of the magnetic junction, including those of the free layer 110, may be defined immediately after deposition or at a later time. For example, once the remaining layers of the magnetic junction have been deposited, the magnetic junction may be defined. In some embodiments, an ion mill may be performed. Thus, portions of step 202 may be spread out over time.

A nonmagnetic spacer layer is provided, via step 204. Step 204 may include depositing MgO, which forms a tunneling barrier layer. In some embodiments, step 104 may include depositing MgO using, for example, radio frequency (RF) sputtering. In other embodiments, metallic Mg may be deposited, then oxidized in step 204. As discussed above with respect to step 202, the edges of the nonmagnetic spacer layer may be defined at a later time, for example after deposition of the remaining layers of the magnetic junction.

A PEL, such as CoFeB, FeB, a Fe/CoFeB bilayer, a half metal and/or a Heusler alloy, may optionally be provided on the nonmagnetic spacer layer 120, via step 206. As discussed above with respect to step 202, the edges of the nonmagnetic spacer layer may be defined at a later time, for example after deposition of the remaining layers of the magnetic junction.

The nonmagnetic spacer layer provided in step 204 may be amorphous as-deposited. However, the nonmagnetic spacer layer is desired to be crystalline. For example, crystalline MgO with a (100) orientation may be desired for enhanced tunneling magnetoresistance (TMR) of the magnetic junction. Consequently, the portion of the magnetic junction that has already been formed is annealed at a temperature of at least three hundred fifty degrees Celsius. Thus, at least the free layer formed in step 202 and the nonmagnetic spacer layer formed in step 204 may optionally be annealed before the pinned layer 130 is formed, via step 208. In some embodiments, step 208 includes performing a rapid thermal anneal (RTA). In such an embodiments, the already-formed portion of the magnetic junction may reach the anneal temperature in minutes or less. However, in other embodiments, the anneal may be performed in another manner, including but not limited to block heating. In some embodiments, the portion of the magnetic junction may be annealed in step 208 for at least 10 minutes and not more than ten hours. Further, in some embodiments, higher anneal temperatures may be used. The anneal temperature may be desired not to exceed six hundred degrees Celsius. In some embodiments, the anneal is performed at a temperature of at least four hundred degrees Celsius. In some such embodiments, the anneal temperature is at least four hundred fifty degrees Celsius. The anneal temperature in some embodiments may be desired not to exceed five hundred degrees Celsius. Note that step 208 may not be performed for the magnetic junction 100', in which the pinned layer 130 is deposited before the free layer 110 and nonmagnetic spacer layer 120. An anneal may still be performed, but it is not before fabrication of the pinned layer 130 and may be at lower anneal temperature(s).

A pinned layer is provided, via step 210. In some embodiments, step 210 occurs before the anneal for the nonmagnetic spacer layer. In others, step 208 occurs before step 210. As discussed above, portions of step 210 may be spaced apart in time. Thus, the nonmagnetic spacer layer 120 is between the pinned layer 130 and the free layer 110. As discussed above with respect to step 202, the edges of the pinned layer may be defined at a later time, for example after deposition of the remaining layers of the magnetic junction.

Using the method 200, the magnetic junction 100, 100', 100" and/or 100'" may be formed. Thus, the benefits of the magnetic junction(s) 100, 100', 100" and/or 100'" may be achieved.

Figure 7:
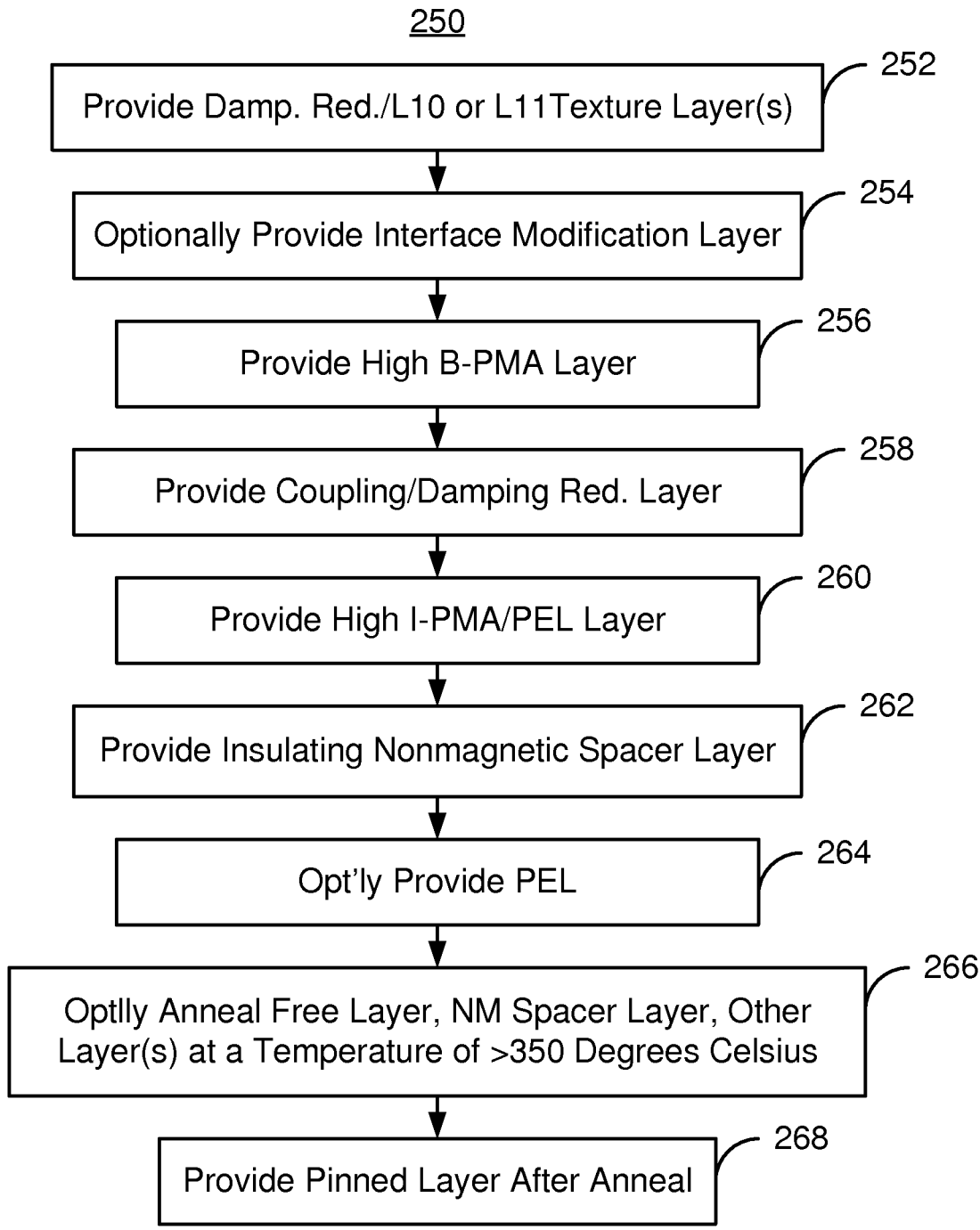
FIG. 7 is a flow chart depicting another exemplary embodiment of a method for providing a magnetic junction including a high PMA free layer and usable in a magnetic memory programmable using spin transfer torque.

FIG. 7 depicts an exemplary embodiment of a method 250 for fabricating a magnetic junction including a high PMA free layer and usable in a magnetic device such as a spin transfer torque random access memory (STT-RAM) and, therefore, in a variety of electronic devices. For simplicity, some steps may be omitted, performed in another or combined. Further, the method 250 may start after other steps in forming a magnetic memory have been performed.

Seed layer(s) are provided, via step 252. The seed layer deposited are configured for the B-PMA material(s) used in the free layer. For example, the seed layers may be used to reduce damping and/or provide a growth template for the desired crystal structure for the B-PMA materials. For example, step 252 may include depositing one or more of AlN, TiN, TiAlN, tantalum oxide, V aluminum oxide, Ta and/or Ru. The edges of the magnetic junction, including those of the seed layer(s), may be defined immediately after deposition or at a later time. For example, once the remaining layers of the magnetic junction have been deposited, the magnetic junction may be defined. In some embodiments, an ion mill may be performed. Thus, portions of step 252 may be spread out over time.

At least one interface modification layer is deposited, via step 254. The interface modification layer may be used to increase the PMA of the free layer to be formed. In some such embodiments, the interface modification layer may also enhance the thermal endurance of the free layer to be formed. For example, the interface modification layer may allow the free layer to maintain its PMA over a wider range of deposition and anneal temperatures. For example, it has been determined that while both Rh and Ir interface modification layers may enhance the PMA of the free layer, Ir may also improve the thermal endurance of the free layer. As discussed above with respect to step 252, the edges of the interface modification layer may be defined at a later time, for example after deposition of the remaining layers of the magnetic junction.

A high B-PMA layer is provided, via step 256. Step 256 may include depositing a B-PMA and/or tetragonal B-PMA material(s). Alloys and/or multilayers may be provided as part of step 256. For example, B-PMA materials provided in step 256 may include but are not limited to FePd, FePdB, CoPt, CoPd, FePt, TbCoFe, GaMn, Co/Pd bilayer(s) having i repeats, Co/Pt bilayer(s) having j repeats, Fe/Pt bilayer(s) having k repeats, Co/Ni bilayer(s) having l repeats, Tb/CoFe bilayer(s) having m repeats and Co/TbCoFe bilayer(s) having n repeats. In such embodiments, i, j, k, l, m and n are integers of at least one. At least some materials, such as CoPd, CoPt and GaMn may be tetragonal B-PMA materials that may have a 200 orientation. As discussed above with respect to step 252, the edges of the B-PMA layer may be defined at a later time and step 256 spread out in time.

A coupling layer is provided, via step 258. In some embodiments, the coupling layer may also function as a damping reduction layer for the B-PMA layer provided in step 256. For example, low RA MgO might be provided in step 258 by depositing and naturally oxidizing an Mg layer. Such an MgO layer may both reduce the intrinsic damping constant of the B-PMA layer and provide a mechanism for controlling the coupling between the B-PMA layer and the I-PMA layer. Step 258 may thus include depositing Ta, Ru, Cr, Ti, W, V, Mg, and/or MgO (such as low RA MgO). As discussed above with respect to step 252, the edges of the coupling layer may be defined at a later time and step 258 spread out in time.

A high I-PMA layer is provided, via step 260. Step 260 may include depositing CoFeB, FeB, CoB, half metal(s) and/or Heusler alloy(s). As discussed above with respect to step 252, the edges of the I-PMA layer may be defined at a later time and step 260 spread out in time.

A nonmagnetic spacer layer is provided, via step 262. Step 262 may include depositing MgO, which forms a tunneling barrier layer. In some embodiments, step 262 may include depositing MgO using RF sputtering or oxidation of metallic Mg. As discussed above with respect to step 252, the edges of the nonmagnetic spacer layer may be defined at a later time, for example after deposition of the remaining portions of the magnetic junction. A PEL, such as CoFeB, FeB, a Fe/CoFeB bilayer, a half metal and/or a Heusler alloy, may optionally be provided on the nonmagnetic spacer layer, via step 264.

The nonmagnetic spacer layer provided in step 262 may be amorphous as-deposited. However, the nonmagnetic spacer layer is desired to be crystalline. Consequently, the portion of the magnetic junction that has already been formed is annealed at a temperature of at least three hundred fifty degrees Celsius, via step 266. Some or all of step 266 may occur before step 264. Thus, multiple anneals may be performed. In some embodiments, step 266 includes performing an RTA. However, in other embodiments, the anneal may be performed in another manner, including but not limited to block heating. In some embodiments, the portion of the magnetic junction may be annealed in step 266 for at least one hour and not more than ten hours. Further, in some embodiments, higher anneal temperatures may be used. The anneal temperature may be desired not to exceed six hundred degrees Celsius. In some embodiments, the anneal is performed at a temperature of at least four hundred degrees Celsius. In some such embodiments, the anneal temperature is at least for hundred fifty degrees Celsius. The anneal temperature in some embodiments may be desired not to exceed five hundred degrees Celsius. In other embodiments, lower temperatures, for example at least three hundred and not more than three hundred fifty degrees Celsius might be used. Note that step 266 may not be performed for a bottom pinned or dual magnetic junction. In some embodiments, an anneal may still be performed after fabrication of the pinned layer and at lower anneal temperature(s).

A pinned layer is provided, via step 268. In some embodiments, step 268 occurs before the anneal for the nonmagnetic spacer layer. In others, step 208 occurs before step 210. As discussed above for step 252, portions of step 268 may be spaced apart in time. Fabrication of the magnetic junction may be completed. For example, an additional nonmagnetic spacer layer and pinned layer may be fabricated if a dual magnetic junction is desired to be fabricated.

Using the method 250 a magnetic junction having a high PMA free layer including a hybrid PMA structure and/or a tetragonal B-PMA structure may be fabricated. Thus, the benefits of such magnetic junction(s) may be achieved.

Figure 8:
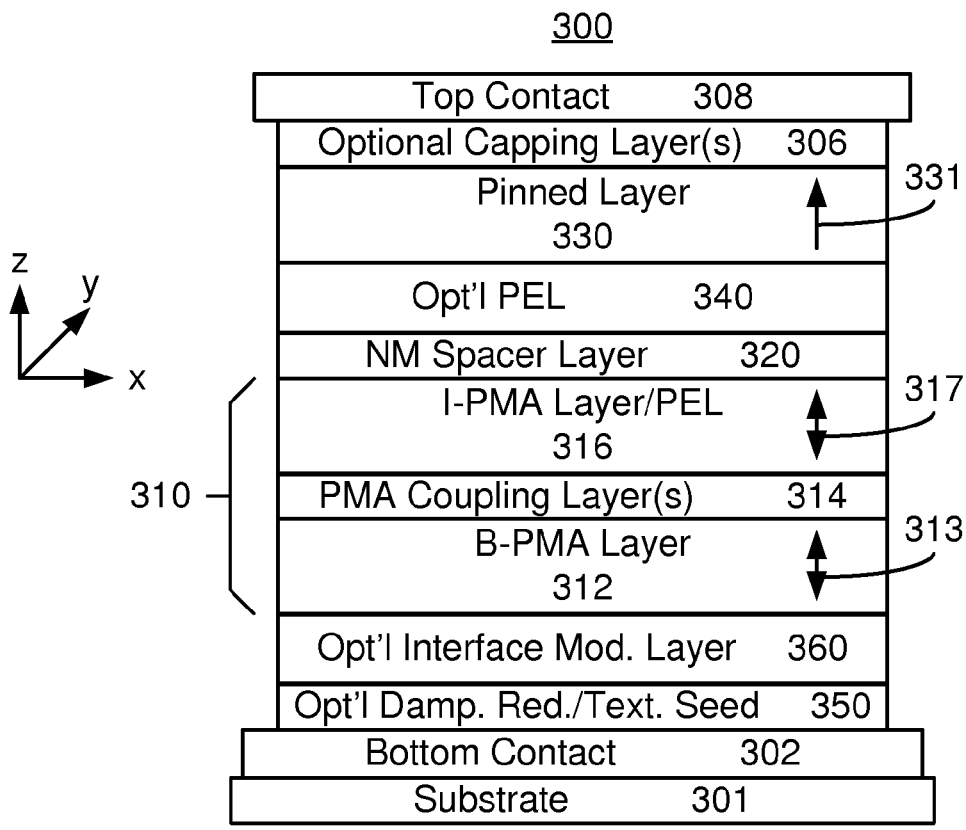
FIG. 8 depicts another exemplary embodiment of a magnetic junction including a high PMA free layer and usable in a magnetic memory programmable using spin transfer torque.

FIG. 8 depicts an exemplary embodiment of a magnetic junction 300 having a high perpendicular magnetic anisotropy (PMA) free layer and which is usable in a magnetic memory programmable utilizing spin transfer. For clarity, FIG. 8 is not to scale. The magnetic junction 300 may be formed using the method 200 and/or 250. The magnetic junction 300 may be used in a magnetic device such as a STT-RAM and, therefore, in a variety of electronic devices.

The magnetic junction 300 includes a free layer 310, a nonmagnetic spacer layer 320, a pinned layer 330 having magnetic moment 331, optional PEL 340, optional seed layer(s) 350 and optional interface modification layer 360. Also shown is an underlying substrate 301 in which devices including but not limited to a transistor may be formed. Bottom contact 302, top contact 308 and optional capping layer(s) 306 are also shown. The free layer 310, nonmagnetic spacer layer 320, pinned layer 330, optional PEL 340, optional seed layer(s) 350 and optional interface modification layer 360 are analogous to the free layer 110/110', the nonmagnetic spacer layer 120, the pinned layer 130, optional PEL 140, and optional seed layer(s) 104/150 respectively, depicted in the magnetic junctions 100, 100', 100" and/or 100'''. The underlying substrate 301, bottom contact 302, top contact 308 and optional capping layer(s) 306 may be analogous to the substrate 101, bottom contact 102, top contact 108 and optional capping layer(s) 106 for the magnetic junctions 100, 100', 100", and/or 100'''.

The magnetic junction 300 is a top pinned magnetic junction. However, in other embodiments, the magnetic junction 300 may be a bottom pinned or dual magnetic junction. An optional pinning layer (not shown) may be used to fix the magnetization (not shown) of the pinned layer 330. However, in other embodiments, the optional pinning layer may be omitted or another structure may be used.

The seed layer(s) 350 may be configured to reduce the damping constant of the free layer 310 and/or may provide a growth template for a L10 or L11 tetragonal B-PMA layer having a 200 orientation. For example, the seed layer(s) 350 may include but are not limited to Ta, Ru, AlN, TiN, TiAlN, tantalum oxide, V and aluminum oxide.

The interface modification layer(s) 360 may also affect the properties of the free layer 310. For example, Ir and/or Rh layer(s) may be used to enhance the PMA of the free layer 310. If Ir is used for the interface modification layer 360, the free layer 310 may also be more thermally robust.

The nonmagnetic spacer layer 320 may be an MgO tunneling barrier layer. The MgO layer may have a 200 orientation for enhanced tunneling magnetoresistance (TMR).

The pinned layer 330 is magnetic. In some embodiments, the pinned layer 330 may be a multilayer. For example, the pinned layer 330 may be a SAF. In other embodiments, the pinned layer 130 may be another multilayer.

The optional PEL 340 may be used to enhance the spin polarization for the pinned layer 330. In some embodiments, the PEL 340 may include CoFeB, FeB, a Fe/CoFeB bilayer, a half metal and/or a Heusler alloy. In some embodiments, the pinned layer 130 may include a bulk PMA structure and/or hybrid PMA structure that is analogous to that described for the free layer, below.

The perpendicular magnetic anisotropy energies of free layer 310 and pinned layer 330 exceed the out-of-plane demagnetization energies of the free layer 310 and the pinned layer 330, respectively. Consequently, the magnetic moments of the free layer 310 and the pinned layer 330, respectively, may be perpendicular to plane. The magnetic junction 300 is also configured to allow the free layer 310 to be switched between stable magnetic states when a write current is passed through the magnetic junction 300. Thus, the free layer 310 is switchable utilizing spin transfer torque.

The free layer 310 includes a B-PMA layer 312 having magnetic moment 313, a coupling layer 314 and an I-PMA layer/PEL 316 (referred to as I-PMA layer 316) having a magnetic moment 317. Thus, the free layer 310 may be considered to include a hybrid PMA structure. As a result, the free layer 310 may have a high PMA. Although only two PMA layers 312 and 316 and one coupling layer 314 are shown, in other embodiments, multiple B-PMA, coupling and I-PMA layers may be used. The B-PMA layer 312 may include but is not limited to FePd, FePdB, CoPt, CoPd, FePt, TbCoFe, GaMn, Co/Pd bilayer(s), Co/Pt bilayer(s), Fe/Pt bilayer(s), Co/Ni bilayer(s), Tb/CoFe bilayer(s) and Co/TbCoFe bilayer(s). At least some materials, such as CoPd, CoPt and GaMn may be tetragonal B-PMA materials. The coupling layer 314 may include but is not limited to Ta, Ru, Cr, Ti, W, V, Mg, and MgO. Low RA MgO may be used to reduce the damping of the B-PMA layer 312. The I-PMA layer 316 may include but is not limited to CoFeB, CoFeB, CoB, half-metallic material(s) and Heusler alloy(s).

The magnetic junction 300 may have improved performance. Use of the hybrid B-PMA structure free layer 310 having layers 312, 314 and 316 may improve the thermal stability, perpendicular magnetic anisotropy, write current magnetoresistance and/or damping constant of the free layer 310. Performance may thus be improved. For some embodiments, a higher anneal temperature may be used if the anneal is performed before the pinned layer 330 is fabricated. Again, magnetoresistance may be improved. Thus, performance of the magnetic junction 300 may be enhanced.

Figure 9:
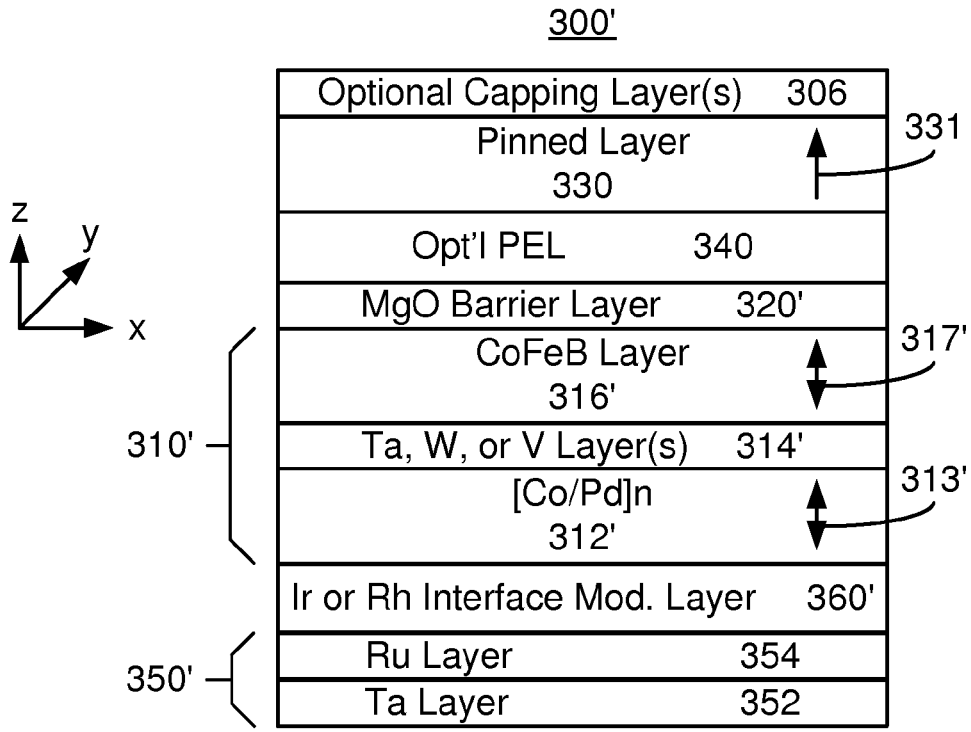
FIG. 9 depicts another exemplary embodiment of a magnetic junction including a high PMA free layer and usable in a magnetic memory programmable using spin transfer torque.

FIG. 9 depicts an exemplary embodiment of a magnetic junction 300' including a high PMA free layer and usable in a magnetic memory programmable using spin transfer torque, as well as surrounding structures. For clarity, FIG. 9 is not to scale. The magnetic junction 300' may be used in a magnetic device such as a STT-RAM and, therefore, in a variety of electronic devices. The magnetic junction 300' is analogous to the magnetic junction 300. Consequently, similar components have analogous labels. The magnetic junction 300' includes a free layer 310', a nonmagnetic spacer layer 320', a pinned layer 330 having a magnetic moment 331, an optional PEL 340, a seed layer 350' and an interface modification layer 360' that are analogous to the free layer 310, the nonmagnetic spacer layer 320, the pinned layer 330 having a magnetic moment 331, the optional PEL 340, the seed layer 350 and the interface modification layer 360 respectively, depicted in the magnetic junction 300. For simplicity, the underlying substrate, bottom contact, top contact and optional capping layer(s) are omitted.

As can be seen in FIG. 9, the seed layer 350' is a bilayer including a Ta layer 352 and a Ru layer 354. The modification layer 360' is explicitly indicated as including Ir or Rh. The nonmagnetic spacer layer 320' is a crystalline MgO tunneling barrier layer.

The free layer 310' includes a B-PMA layer 312' having a magnetic moment 313', a coupling layer 314' and an I-PMA layer 316' having a magnetic moment 313'. The I-PMA layer 316' is a CoFeB layer. The coupling layer 316 includes Ta, W, and/or V. The B-PMA layer 312' is a multilayer including n repeats of a Co/Pd bilayer.

The magnetic junction 300' may have improved performance. The free layer 310' including layers 312', 314' and 316' may exhibit improved the thermal stability, perpendicular magnetic anisotropy, write current magnetoresistance and/or damping constant. Performance may thus be improved. For some embodiments, a higher anneal temperature may be used if the anneal is performed before the pinned layer 330 is fabricated. Again, magnetoresistance may be improved. Thus, performance of the magnetic junction 300' may be enhanced.

Figure 10:
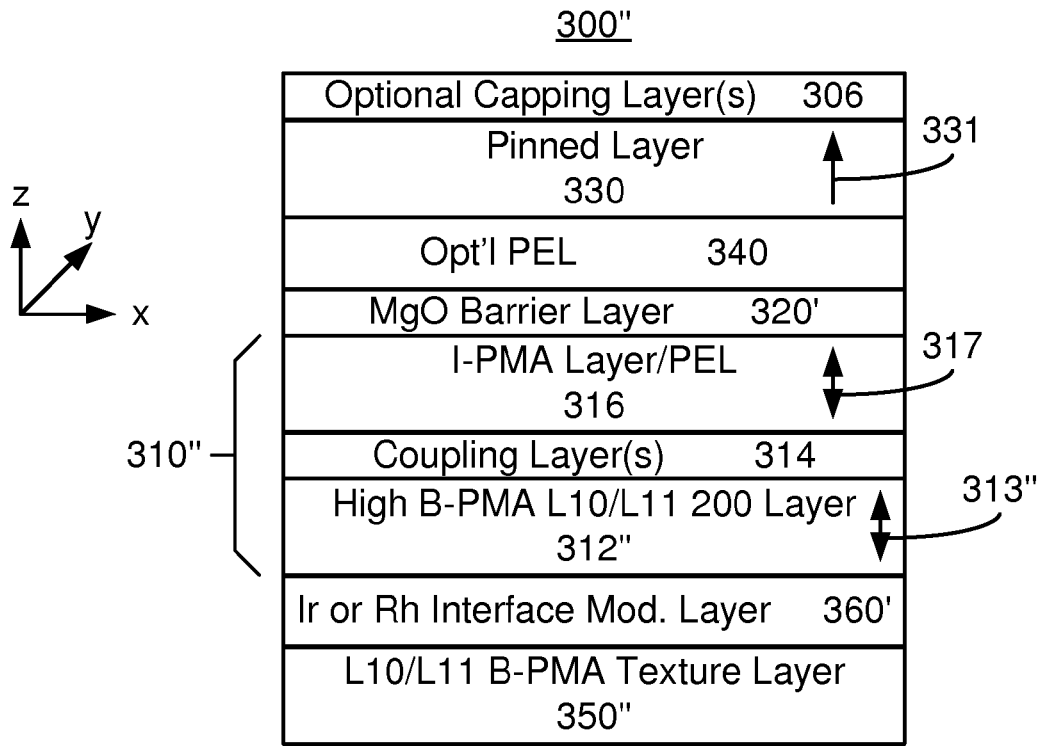
FIG. 10 depicts another exemplary embodiment of a magnetic junction including a high PMA free layer and usable in a magnetic memory programmable using spin transfer torque.

FIG. 10 depicts an exemplary embodiment of a magnetic junction 300" including a high PMA free layer and usable in a magnetic memory programmable using spin transfer torque, as well as surrounding structures. For clarity, FIG. 10 is not to scale. The magnetic junction 300" may be used in a magnetic device such as a STT-RAM and, therefore, in a variety of electronic devices. The magnetic junction 300" is analogous to the magnetic junctions 300 and/or 300'. Consequently, similar components have analogous labels. The magnetic junction 300" includes a free layer 310", a nonmagnetic spacer layer 320', a pinned layer 330 having a magnetic moment 331, an optional PEL 340, a seed layer 350" and an interface modification layer 360' that are analogous to the free layer 310/310', the nonmagnetic spacer layer 320/320', the pinned layer 330 having a magnetic moment 331, the optional PEL 340, the seed layer 350/350' and the interface modification layer 360' respectively, depicted in the magnetic junction 300. For simplicity, the underlying substrate, bottom contact, top contact and optional capping layer(s) are omitted.

In the embodiment shown, the seed layer 350" may be used for a tetragonal B-PMA layer in the free layer 310". For example, the layer 350" may be an AlTiN and/or TiN layer. The free layer 310" includes a B-PMA layer 312" having a magnetic moment 313", a coupling layer 314 and an I-PMA layer 316' having a magnetic moment 313'. In the embodiment shown, the B-PMA layer 312" is a tetragonal B-PMA layer.

The magnetic junction 300" may have improved performance. The free layer 310" including layers 312", 314 and 316 may exhibit improved the thermal stability, perpendicular magnetic anisotropy, write current magnetoresistance and/or damping constant. Performance may thus be improved. For some embodiments, a higher anneal temperature may be used if the anneal is performed before the pinned layer 330 is fabricated. Again, magnetoresistance may be improved. Thus, performance of the magnetic junction 300" may be enhanced.

Figure 11:
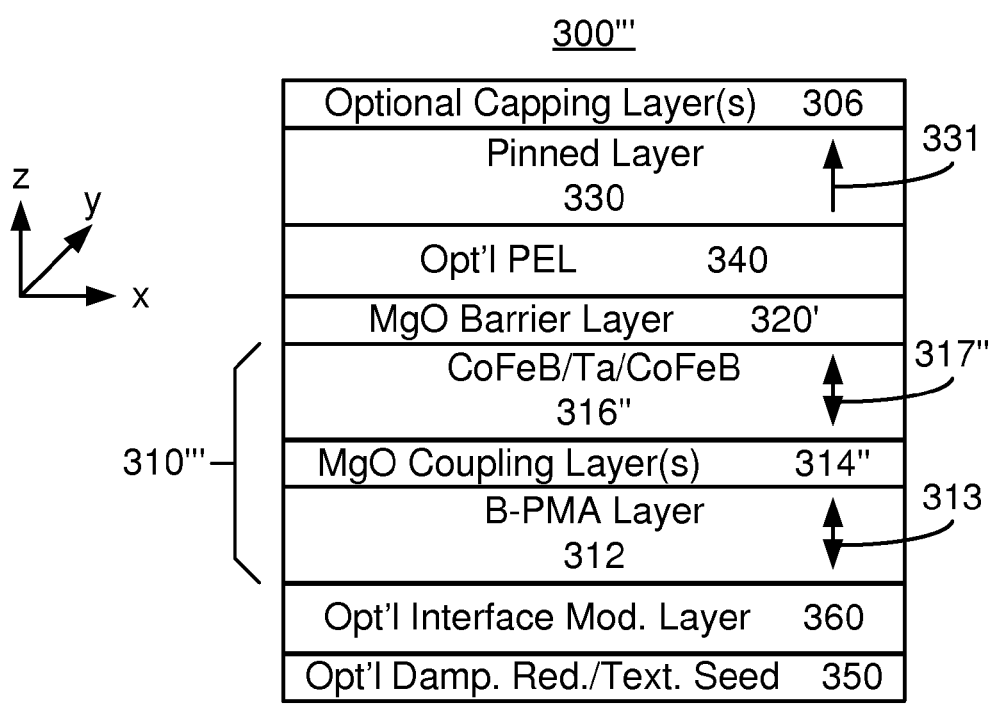
FIG. 11 depicts another exemplary embodiment of a magnetic junction including a high PMA free layer and usable in a magnetic memory programmable using spin transfer torque.
Figure 12:
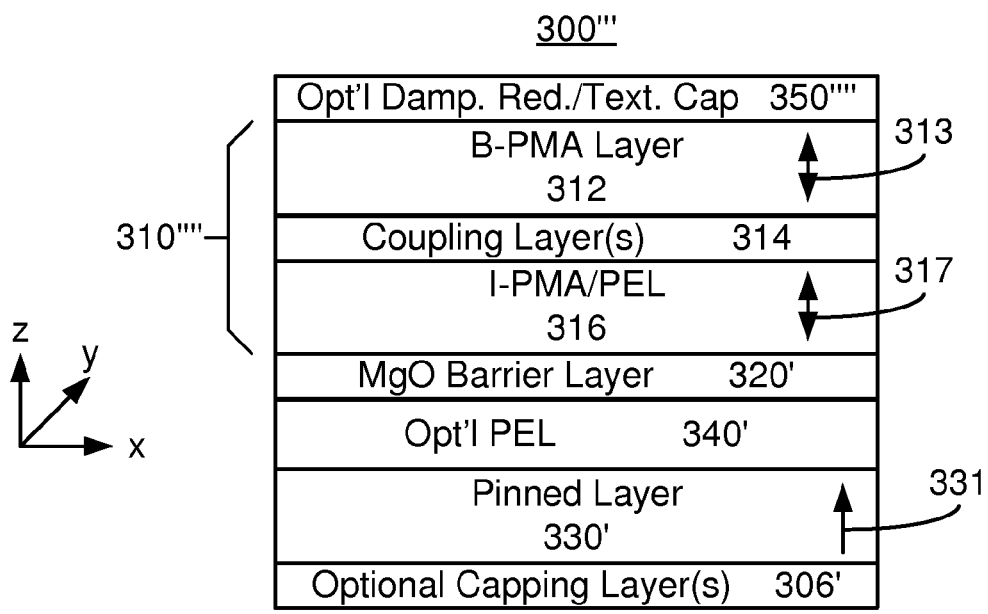
FIG. 12 depicts another exemplary embodiment of a magnetic junction including a high PMA free layer and usable in a magnetic memory programmable using spin transfer torque.

FIG. 11 depicts an exemplary embodiment of a magnetic junction 300'" including a high PMA free layer and usable in a magnetic memory programmable using spin transfer torque, as well as surrounding structures. For clarity, FIG. 11 is not to scale. The magnetic junction 300'" may be used in a magnetic device such as a STT-RAM and, therefore, in a variety of electronic devices. The magnetic junction 300'" is analogous to the magnetic junctions 300, 300' and/or 300". Consequently, similar components have analogous labels. The magnetic junction 300'" includes a free layer 310'", a nonmagnetic spacer layer 320', a pinned layer 330 having a magnetic moment 331, an optional PEL 340, a seed layer 350 and an interface modification layer 360 that are analogous to the free layer 310/310'/310", the nonmagnetic spacer layer 320/320', the pinned layer 330 having a magnetic moment 331, the optional PEL 340, the seed layer 350/350' and the interface modification layer 360' respectively, depicted in the magnetic junction 300. For simplicity, the underlying substrate, bottom contact, top contact and optional capping layer(s) are omitted.

In the embodiment shown, the free layer 310'" includes a B-PMA layer 312 having a magnetic moment 313, a coupling layer 314" and an I-PMA layer 316" having a magnetic moment 317". In the embodiment shown, the coupling layer 314" is a low RA MgO layer 314". Further, the I-PMA layer/PEL 316" is a CoFeB/Ta/CoFeB trilayer.

The magnetic junction 300'" may have improved performance. The free layer 310'" including layers 312, 314" and 316" may exhibit improved the thermal stability, perpendicular magnetic anisotropy, write current magnetoresistance and/or damping constant. Performance may thus be improved. For some embodiments, a higher anneal temperature may be used if the anneal is performed before the pinned layer 330 is fabricated. Again, magnetoresistance may be improved. Thus, performance of the magnetic junction 300'" may be enhanced.

Figure 13:
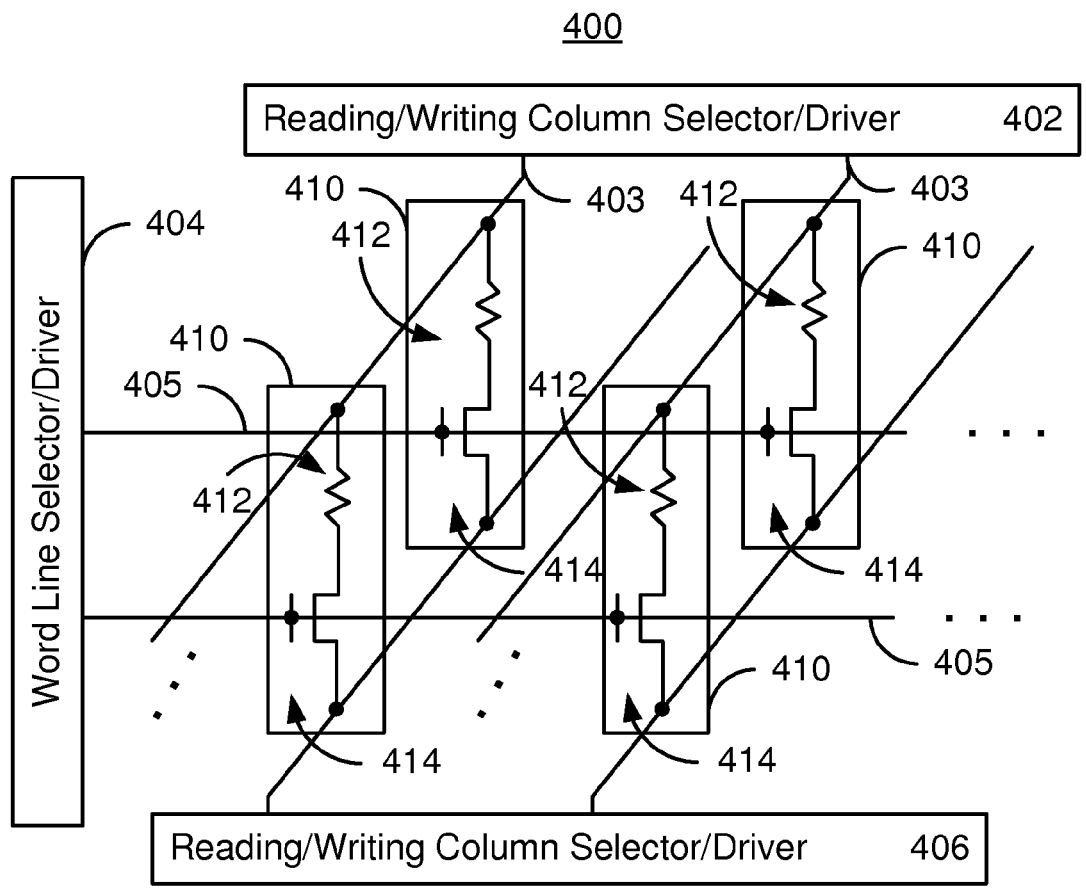
FIG. 13 depicts an exemplary embodiment of a memory utilizing magnetic junctions in the memory element(s) of the storage cell(s).

FIG. 13 depicts an exemplary embodiment of a memory 400 that may use one or more of the magnetic junctions 100, 100', 100", 100'", 300, 300', 300" and/or 300'". The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 100', 100", 100'", 300, 300', 300" and/or 300'" disclosed herein. Although one magnetic junction 412 is shown per cell 410, in other embodiments, another number of magnetic junctions 412 may be provided per cell. As such, the magnetic memory 400 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit scope of the method and system. Accordingly, many modifications may be made by one of ordinary skill in the art without departing from the spirit and scope of the appended claims.

We claim:

1. A magnetic junction residing on a substrate and usable in a magnetic device comprising:
   a seed layer;
   an interface modification layer;
   a free layer, the free layer including at least one of a hybrid perpendicular magnetic anisotropy (PMA) structure and tetragonal bulk perpendicular magnetic anisotropy (B-PMA) structure, the seed layer being between the free layer and the substrate, the interface modification layer being between the seed layer and the free layer;
   a nonmagnetic spacer layer; and
   a pinned layer, the nonmagnetic spacer layer residing between the pinned layer and the free layer, at least one of the free layer and the pinned layer having a perpendicular magnetic anisotropy energy greater than an out-of-plane demagnetization energy;
   wherein the magnetic junction is configured such that the free layer is switchable between a plurality of stable magnetic states when a write current is passed through the magnetic junction.

2. The magnetic junction of claim 1 wherein the free layer includes the hybrid PMA structure, the hybrid PMA structure including a B-PMA layer, an interfacial PMA (I-PMA) layer and a coupling layer between the B-PMA layer and the I-PMA layer.

3. The magnetic junction of claim 2 wherein the B-PMA layer includes at least one of FePd, FePdB, CoPt, CoPd, FePt, TbCoFe, GaMn, at least one Co/Pd bilayer, at least one Co/Pt bilayer, at least one Fe/Pt bilayer, at least one Co/Ni bilayer, at least one Tb/CoFe bilayer, at least one TbCo/Fe bilayer, at least one TbCo/FeB bilayer, and at least one Co/TbCoFe bilayer.

4. The magnetic junction of claim 2 wherein the I-PMA layer includes at least one of CoFeB, FeB, CoB, at least one half-metallic material and at least one Heusler alloy.

5. The magnetic junction of claim 2 wherein the coupling layer includes at least one of Ta, Ru, Cr, Ti, W, V, Mg, and MgO.

6. The magnetic junction of claim 1 wherein the free layer includes the tetragonal B-PMA structure, the B-PMA structure including at least one of CoPd, CoPt, and GaMn, the magnetic junction further including:
   a seed layer including at least one of AlN, TiN, TiAlN, tantalum oxide, V and aluminum oxide.

7. The magnetic junction of claim 1 wherein the seed layer includes at least one of MgO, AlN, TiN, TiAlN, tantalum oxide, V and aluminum oxide.

8. The magnetic junction of claim 7 wherein the interface modification layer includes at least one of Ir and Rh.

9. The magnetic junction of claim 1 further comprising a capping layer, the free layer being between the capping layer and the substrate, the capping layer including at least one of MgO, AlN, TiN, TiAlN, tantalum oxide, V and aluminum oxide.

10. A magnetic memory residing on a substrate, the magnetic memory comprising:
   a plurality of magnetic storage cells, each of the plurality of magnetic storage cells including at least one magnetic junction, the at least one magnetic junction including a seed layer, an interface modification layer, a free layer, a nonmagnetic spacer layer, and a pinned layer, the seed layer being between the free layer and the substrate, the interface modification layer being between the seed layer and the free layer, the free layer including at least one of a hybrid perpendicular magnetic anisotropy (PMA) structure and tetragonal bulk perpendicular magnetic anisotropy (B-PMA) structure, the nonmagnetic spacer layer residing between the pinned layer and the free layer, at least one of the free layer and the pinned layer having a perpendicular magnetic anisotropy energy greater than an out-of-plane demagnetization energy, the magnetic junction being configured such that the free layer is switchable between a plurality of stable magnetic states when a write current is passed through the magnetic junction; and
   a plurality of bit lines coupled with the plurality of magnetic storage cells.

11. The magnetic memory of claim 10 wherein the free layer includes the hybrid PMA structure, the hybrid PMA structure including a B-PMA layer, an interfacial PMA (I-PMA) layer and a coupling layer between the B-PMA layer and the I-PMA layer, the B-PMA layer including at least one of FePd, FePdB, CoPt, CoPd, FePt, TbCoFe, GaMn, at least one Co/Pd bilayer, at least one Co/Pt bilayer, at least one Fe/Pt bilayer, at least one Co/Ni bilayer, at least one Tb/CoFe bilayer, at least one TbCo/Fe bilayer, at least one TbCo/FeB bilayer, and at least one Co/TbCoFe bilayer, the I-PMA layer including at least one of CoFeB, FeB, CoB, at least one half-metallic material and at least one Heusler alloy.

12. The magnetic memory of claim 11 wherein the coupling layer includes at least one of Ta, Ru, Cr, Ti, W, V, Mg, and MgO.

13. The magnetic memory of claim 11 wherein the at least one magnetic junction further includes a seed layer between the free layer and the substrate, the seed layer including at least one of MgO, AlN, TiN, TiAlN, tantalum oxide, V and aluminum oxide.

14. The magnetic memory of claim 11 wherein the interface modification layer includes at least one of Ir and Rh.

15. A method for providing magnetic junction residing on a substrate and usable in a magnetic device, the method comprising:
   providing a seed layer;
   providing an interface modification layer on the seed layer;
   providing a free layer, the free layer including at least one of a hybrid perpendicular magnetic anisotropy (PMA) structure and tetragonal bulk perpendicular magnetic anisotropy (B-PMA) structure, the seed layer being between the free layer and the substrate, the interface modification layer being between the seed layer and the free layer;
   providing a nonmagnetic spacer layer; and
   providing a pinned layer, the nonmagnetic spacer layer residing between the pinned layer and the free layer, at least one of the free layer and the pinned layer having a perpendicular magnetic anisotropy energy greater than an out-of-plane demagnetization energy;
   wherein the magnetic junction is configured such that the free layer is switchable between a plurality of stable magnetic states when a write current is passed through the magnetic junction.

16. A method for providing magnetic junction residing on a substrate and usable in a magnetic device, the method comprising:
   providing a free layer, the free layer including at least one of a hybrid perpendicular magnetic anisotropy (PMA) structure and tetragonal bulk perpendicular magnetic anisotropy (B-PMA) structure;
   providing a nonmagnetic spacer layer;
   annealing the free layer and the nonmagnetic spacer layer at an anneal temperature of at least three hundred fifty degrees Celsius;
   providing a pinned layer, the nonmagnetic spacer layer residing between the pinned layer and the free layer, at least one of the free layer and the pinned layer having a perpendicular magnetic anisotropy enemy greater than an out-of-plane demagnetization energy;
   wherein the magnetic junction is configured such that the free layer is switchable between a plurality of stable magnetic states when a write current is passed through the magnetic junction; and wherein the step of providing the pinned layer further includes providing the pinned layer after the annealing step.

17. The method of claim 15 wherein the free layer includes the hybrid PMA structure, the hybrid PMA structure including a B-PMA layer, an interfacial PMA (I-PMA) layer and a coupling layer between the B-PMA layer and the I-PMA layer, the B-PMA layer including at least one of FePd, FePdB, CoPt, CoPd, FePt, TbCoFe, GaMn, at least one Co/Pd bilayer, at least one Co/Pt bilayer, at least one Fe/Pt bilayer, at least one Co/Ni bilayer at least one Tb/CoFe bilayer(s), at least one TbCo/Fe bilayer, at least one TbCo/FeB bilayer, and at least one Co/TbCoFe bilayer(s), wherein the I-PMA layer includes at least one of CoFeB, FeB, CoB, at least one half-metallic material and at least one Heusler alloy and wherein the coupling layer includes at least one of Ta, Ru, Cr, Ti, W, V, Mg, and MgO.

18. The method of claim 15 wherein the seed layer includes at least one of MgO, AlN, TiN, TiAlN, tantalum oxide, V and aluminum oxide.

19. The method of claim 18 wherein the interface modification layer includes at least one of Ir and Rh.

* * * * *